(12) United States Patent
Park

(10) Patent No.: US 12,358,733 B2
(45) Date of Patent: Jul. 15, 2025

(54) ARTICLE TRANSFERRING APPARATUS

(71) Applicant: SEMES CO., LTD., Cheonan-si (KR)

(72) Inventor: No Jae Park, Seoul (KR)

(73) Assignee: SEMES CO., LTD, Chungcheongnam-do (KR)

( * ) Notice: Subject to any disclaimer, the term of this patent is extended or adjusted under 35 U.S.C. 154(b) by 125 days.

(21) Appl. No.: 18/148,021

(22) Filed: Dec. 29, 2022

(65) Prior Publication Data

US 2023/0211961 A1 Jul. 6, 2023

(30) Foreign Application Priority Data

Dec. 30, 2021 (KR) .................. 10-2021-0192716

(51) Int. Cl.
*B65G 47/86* (2006.01)
*B65G 47/08* (2006.01)
*B65G 47/26* (2006.01)

(52) U.S. Cl.
CPC ......... *B65G 47/842* (2013.01); *B65G 47/082* (2013.01); *B65G 47/261* (2013.01); *B65G 2201/0297* (2013.01)

(58) Field of Classification Search
CPC .. B65G 47/842; B65G 47/082; B65G 47/261; B65G 2201/0297; B65G 49/07; B65G 1/0457; H01L 21/67733; H01L 21/67736; H01L 21/67769; H01L 21/673; H01L 21/6773; H01L 21/67706; B61B 3/02
See application file for complete search history.

(56) References Cited

U.S. PATENT DOCUMENTS

| | | | | |
|---|---|---|---|---|
| 8,348,588 | B2 * | 1/2013 | Yoshida | ............ H01L 21/67736 414/940 |
| 9,073,691 | B2 * | 7/2015 | Morimoto | ............ B65G 1/0457 |
| 9,558,977 | B2 * | 1/2017 | Usami | ............... H01L 21/67712 |
| 2012/0263562 | A1 * | 10/2012 | Mizokawa | ........ H01L 21/67736 414/618 |
| 2014/0003902 | A1 * | 1/2014 | Inui | ........................ B65G 49/00 414/749.1 |
| 2021/0362949 | A1 * | 11/2021 | Morimoto | ................. B61B 3/02 |

FOREIGN PATENT DOCUMENTS

| | | | | |
|---|---|---|---|---|
| JP | 2002-362737 | A | | 12/2002 |
| JP | 2020138820 | A | | 9/2020 |
| JP | 6881486 | B2 * | 6/2021 | ............ B61B 12/00 |
| KR | 20120095848 | A * | 8/2012 | |
| KR | 10-20170087523 | A | | 7/2017 |

(Continued)

OTHER PUBLICATIONS

Korean Office Action, dated Jul. 10, 2023, issued in corresponding Korean Patent Application No. 10-2021-0192716.

*Primary Examiner* — Gene O Crawford
*Assistant Examiner* — Abby A Jorgensen
(74) *Attorney, Agent, or Firm* — Harness, Dickey & Pierce, P.L.C.

(57) ABSTRACT

An article transferring apparatus includes a vehicle configured to travel along a travel rail installed on a ceiling, a vehicle main body connected to the vehicle and defining loading spaces in which articles are to be loaded, and a hoist module including a grip unit configured to grip a desired one of the articles and load and unload the articles to/from the loading spaces.

20 Claims, 12 Drawing Sheets

(56) References Cited

FOREIGN PATENT DOCUMENTS

| KR | 20200076298 | A | * | 6/2020 |
| KR | 20200100982 | A | * | 8/2020 |
| KR | 10-20210002427 | A | | 1/2021 |
| KR | 20210002427 | A | * | 1/2021 |
| KR | 102217740 | B1 | * | 2/2021 |
| KR | 102289021 | B1 | * | 8/2021 |
| KR | 10-20210145675 | A | | 12/2021 |

* cited by examiner

ARTICLE TRANSFERRING APPARATUS

CROSS-REFERENCE TO RELATED APPLICATIONS

This application claims priority to and the benefit of Korean Patent Application No. 10-2021-0192716 filed in the Korean Intellectual Property Office on Dec. 30, 2021, the entire contents of which are incorporated herein by reference.

TECHNICAL FIELD

The present invention relates to an article transferring apparatus.

BACKGROUND ART

In general, in order to manufacture a semiconductor device, various types of processes, such as deposition, photography, and etching, are performed, and devices performing each of these processes are arranged in a semiconductor manufacturing line. Objects, such as wafers, for performing a semiconductor device manufacturing process may be provided to each semiconductor processing device in a state accommodated in a container, such as a FOUP. In addition, objects which has been processed may be recovered from each semiconductor processing device into a container, and the container including the recovered object may be transferred to the outside.

The container is transferred by Overhead Hoist Transport (OHT) device. The OHT device transfers a container containing an object to a load port of any one of semiconductor processing devices. In addition, the OHT device may pick up a container containing a processed object from a load port and transfer the container to the outside or to another one of semiconductor processing devices.

However, the current OHT device can move with only one load (container) per OHT. If the loads (containers) having the same destination are transferred, the OHT devices equal to the number of loads is required, resulting in an inefficient abnormal transfer situation, such as an OHT bottleneck phenomenon.

SUMMARY OF THE INVENTION

The present invention has been made in an effort to provide an article transferring apparatus capable of preventing a bottleneck phenomenon during load transferring.

The object of the present invention is not limited thereto, and other objects not mentioned will be clearly understood by those of ordinary skill in the art from the following description.

An exemplary embodiment of the present invention provides an article transferring apparatus, including: a vehicle traveling along a travel rail installed on a ceiling; a vehicle main body connected to the vehicle and providing loading spaces in which articles are loaded; and a hoist module including a grip unit that grips an article and loading and unloading articles to/from the loading spaces.

Further, the article transferring apparatus may further include a horizontal moving member installed in the vehicle main body and moving the hoist module in a horizontal direction so that the grip unit moves to any one of the loading spaces.

Further, in the vehicle main body, the loading spaces may be provided in parallel with a traveling direction of the vehicle so that articles are loaded in a row along the traveling direction of the vehicle, and the horizontal moving member may include a horizontal rail part installed in the vehicle body in a straight line along the traveling direction.

Further, the vehicle main body may include an article entrance through which articles enter and exit in a center of a floor, and the loading spaces may be disposed in all directions around the article entrance.

Further, the horizontal moving member may include horizontal rail parts provided so that the hoist module moves in all directions from the center of the vehicle main body.

Further, the hoist module may further include a lifting unit for lifting the grip unit.

Further, the vehicle main body may further include an article fixing part for fixing an article located in the loading space.

Further, the article fixing part may include: a fixing member for fixing the article so that the article is not separated from the loading space; and an actuating member for moving the fixing member between a fixing position where the fixing member fixes an article and a releasing position so that the article loaded in the loading space is lifted by the host module.

Further, the fixing member may reciprocate between the fixing position and the releasing position while turning by the actuating member.

Another exemplary embodiment of the present invention provides an article transferring apparatus, including: a travel rail provided along a ceiling of a manufacturing line in which processing devices are continuously disposed; and a transferring unit device traveling on the travel rail and sending and receiving an article to and from a mounting place of the processing device, in which the transferring unit includes: a vehicle traveling along the travel rail; a vehicle main body connected to the vehicle and providing loading parts on which articles are loaded; a hoist module installed in the vehicle main body and capable of exchanging the article with the mounting place and each of the loading parts; and a horizontal moving member for horizontally moving the hoist module in the vehicle main body so that the hoist module is located on any one of the loading parts.

Further, the hoist module may include: a grip unit that grips the article; and a lifting unit for moving up and down the grip unit.

Further, the loading parts may be provided so that articles are loaded in a line along a traveling direction of the vehicle, and the horizontal moving member may include a horizontal rail part installed in a straight line in the vehicle body along the traveling direction.

Further, the vehicle main body may include an article entrance through which articles enter and exit in a center of a floor, and the loading parts may be disposed in all directions around the article entrance.

Further, the horizontal moving member may include horizontal rail parts provided so that the hoist module moves in all directions from the center of the vehicle main body.

Further, the loading part may include an article fixing part for fixing the article.

Further, the article fixing part may include: a fixing member for fixing the article so that the article is not separated from the loading space; and an actuating member for moving the fixing member to a fixing position for fixing an article and a releasing position where the hoist module transfers the article from the mounting place to the loading part or transfers the article from the loading part to the mounting place.

Further, the fixing member may reciprocate between the fixing position and the releasing position while turning by the actuating member.

Still another exemplary embodiment of the present invention provides an article transferring apparatus, including: a travel rail provided along a ceiling of a manufacturing line in which processing devices are continuously disposed; and a transferring unit device traveling on the travel rail and sending and receiving an article to and from a mounting place of the processing device, in which the transferring unit includes: a vehicle traveling along the travel rail; a vehicle main body connected to the vehicle and providing loading parts on which articles are loaded; a hoist module installed in the vehicle main body and capable of exchanging the article with the mounting place and each of the loading parts; and a horizontal moving member for horizontally moving the hoist module in the vehicle main body so that the hoist module is located on any one of the loading parts, and the loading parts have a straight arrangement in which articles are loaded in a line along a traveling direction of the vehicle or a rhombic arrangement in which articles are loaded in all directions around a central opening through which articles enter and exist.

Further, the loading part may include an article fixing part for fixing the article.

Further, the hoist module may include: a grip unit capable of gripping and loading/unloading one article selected from among the articles loaded in the loading parts; and a lifting unit for moving up and down the grip unit, and the article fixing part may include: a fixing member for fixing the article so that the article is not separated from the loading space; and an actuating member for moving the fixing member to a fixing position for fixing an article and a releasing position where the hoist module transfers the article from the mounting place to the loading part or transfers the article from the loading part to the mounting place.

According to the exemplary embodiment of the present invention, it is possible to increase transferring efficiency and prevent an abnormal situation, such as a bottleneck phenomenon, by transferring substrate accommodating containers having the same destination or direction in the state where the substrate accommodating containers are loaded.

The effect of the present invention is not limited to the foregoing effects, and those skilled in the art may clearly understand non-mentioned effects from the present specification and the accompanying drawings.

DETAILED DESCRIPTION

Figure 1:
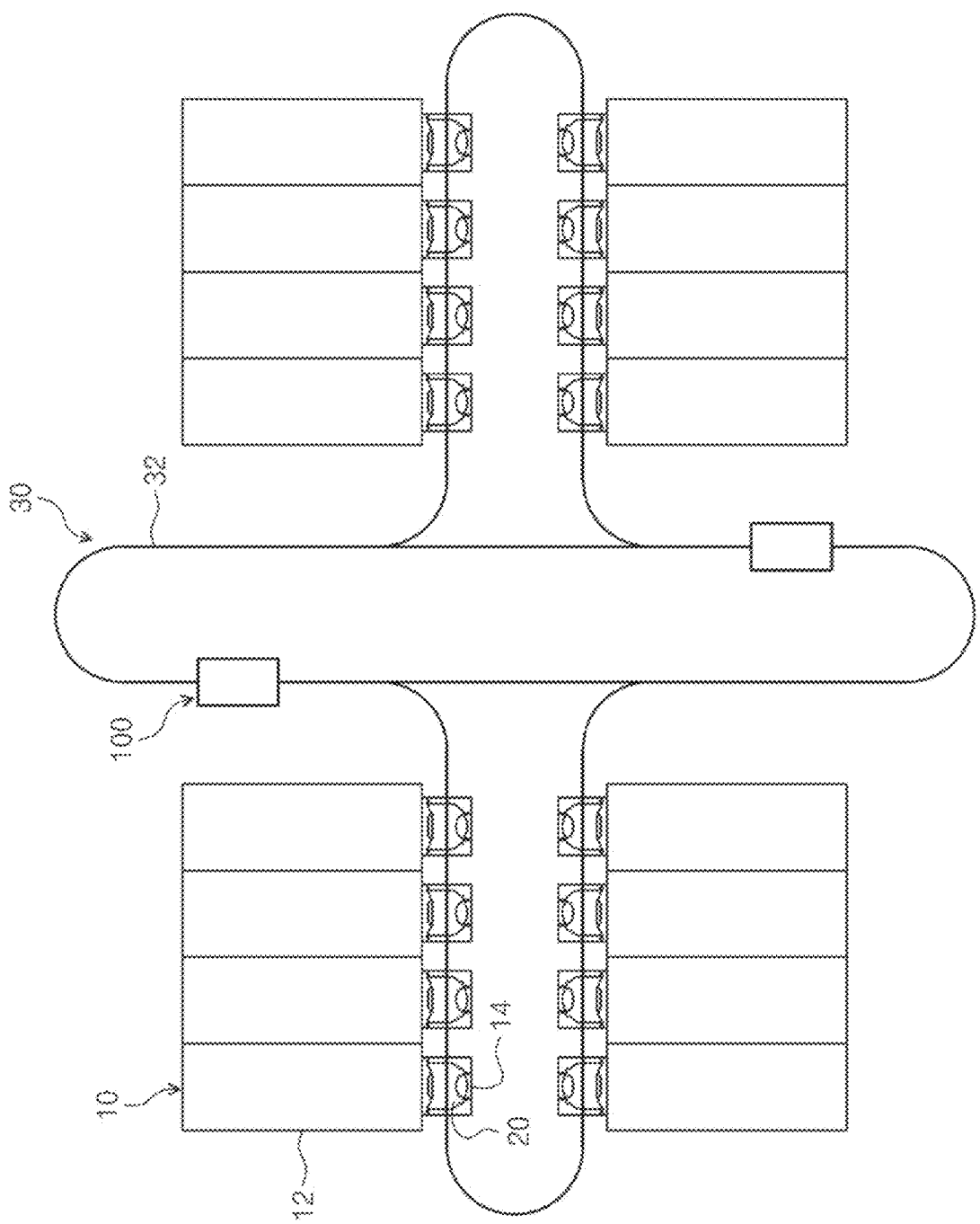
FIG. 1 is a top plan view of a transferring facility provided with an article transferring apparatus.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations, such as "comprises" or "comprising" will be understood to imply the inclusion of stated elements but not the exclusion of any other elements. It will be appreciated that terms "including" and "having" are intended to designate the existence of characteristics, numbers, operations, operations, constituent elements, and components described in the specification or a combination thereof, and do not exclude a possibility of the existence or addition of one or more other characteristics, numbers, operations, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between ~" and "just between ~" or "adjacent to ~" and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

Figure 2:
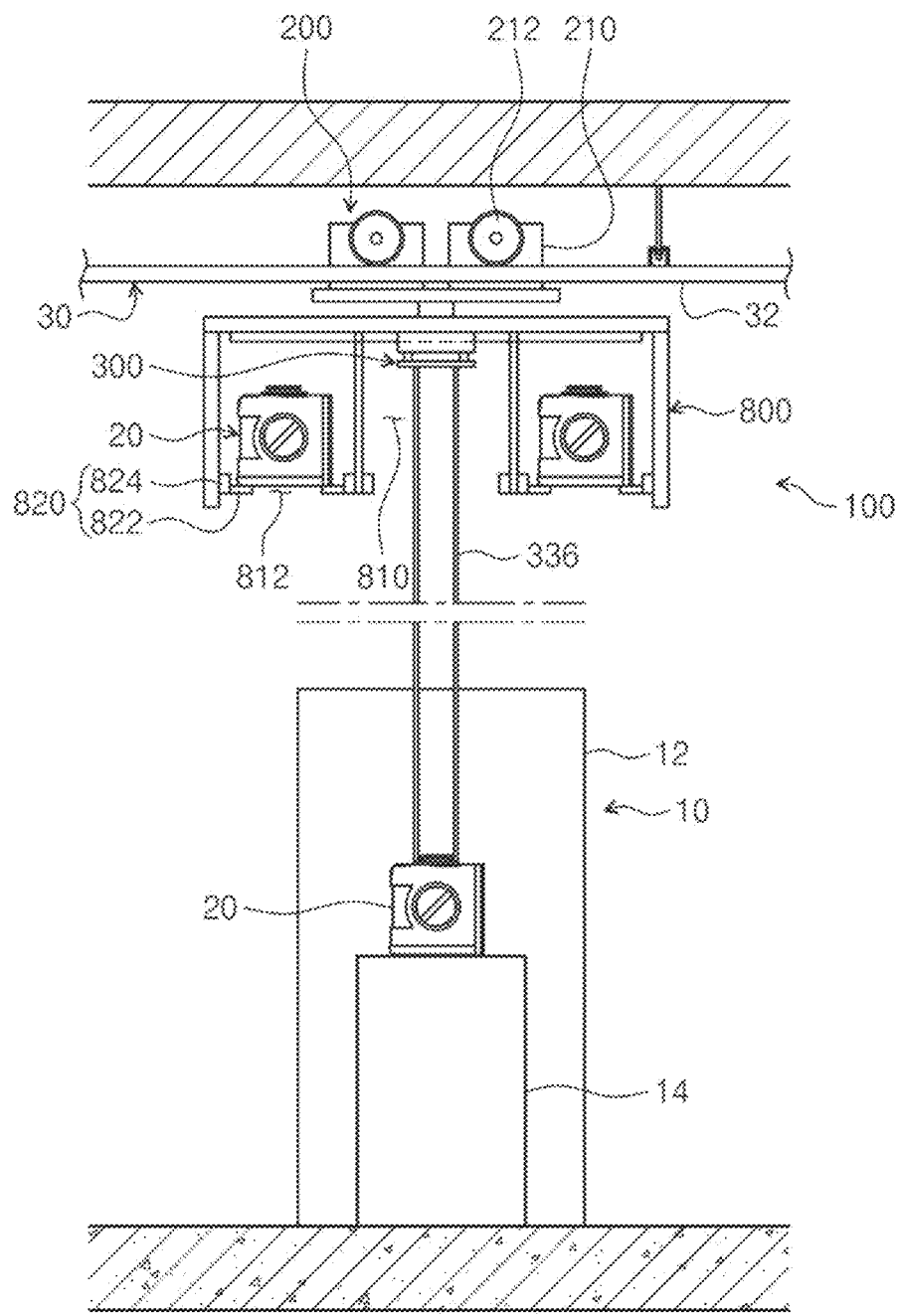
FIG. 2 is a side view of the article transferring apparatus illustrating a situation in which a transferring target article is received and handed over to a mounting place.

FIG. 1 is a top plan view of a transferring facility provided with an article transferring apparatus, and FIG. 2 is a side view of the article transferring apparatus illustrating a situation in which a transferring target article is received and handed over to a mounting place.

As illustrated in in FIGS. 1 and 2, an article transferring apparatus 100 may include a transferring vehicle for transferring a transferring target article 20 to a transferring target place 10.

In the present exemplary embodiment, the article transferring apparatus 100 transfers the transferring target article 20 to each of the transferring target places 10 in a transferring facility having a plurality of transferring target places 10. The transferring target article 20 is a target for transferring, and may be, for example, a single article or may be a combination of a plurality of articles, such as a contained article and a container for containing the contained article. In the present exemplary embodiment, the transferring target article 20 may be a substrate accommodating container, such as a Front Opening Unified Pod (FOUP) in which a plurality of substrates is accommodated.

In the present exemplary embodiment, the transferring target place 10 includes a processing device 12 for processing semiconductor substrates and a mounting place 14 for mounting the substrate accommodating container that is the transferring target article 20. For example, the processing device 12 takes out a semiconductor substrate from the substrate accommodating container 20 mounted on the mounting place 14 and processes the semiconductor substrate. Further, the processing device 12 accommodates the processed semiconductor substrate in the substrate accommodating container 20 mounted on the mounting place 14.

As illustrated in in FIG. 1, a plurality of transferring target places 10 is provided in the transferring facility. For example, a transferring path 30 is provided in the transferring facility so as to pass through the plurality of transferring target places 10.

As illustrated in in FIG. 2, in the present exemplary embodiment, the transferring path 30 is defined by a travel rail 32 connected to the ceiling. Further, the mounting place 14 may be installed below the travel rail 32 and at the same time overlapping the travel rail 32 in top plan view (see FIG. 1).

In the present exemplary embodiment, the article transferring apparatus 100 may be an Overhead Hoist Transport (OHT) device. The article transferring apparatus may travel on the travel rail 32 and transfer the plurality of transferring target articles 20 to the transferring target place 10. In the present exemplary embodiment, a plurality of the article transferring apparatuses 100 is provided in the transferring facility. Then, as illustrated in in FIG. 2, the article transferring apparatus 100 may transfer three transferring target articles, and transfers the transferring target articles 20 to the mounting place 14. In other words, the article transferring apparatus 100 moves down the transferring target article 20 from the height at which the article transferring apparatus 100 is disposed (the height of the travel rail 32) toward the mounting place 14 provided below the height and mounts the transferring target article 20 on the mounting place 14.

Hereinafter, an example in which the article transferring apparatus 100 transfers a container in which a substrate, such as a wafer, is accommodated to semiconductor processing devices disposed in a semiconductor manufacturing line will be described as an example. However, the present invention is not limited thereto, and the article transferring apparatus of the present exemplary embodiment may be equally or similarly applied to various manufacturing lines requiring transferring of articles and/or containers in which articles are accommodated.

Figure 3:
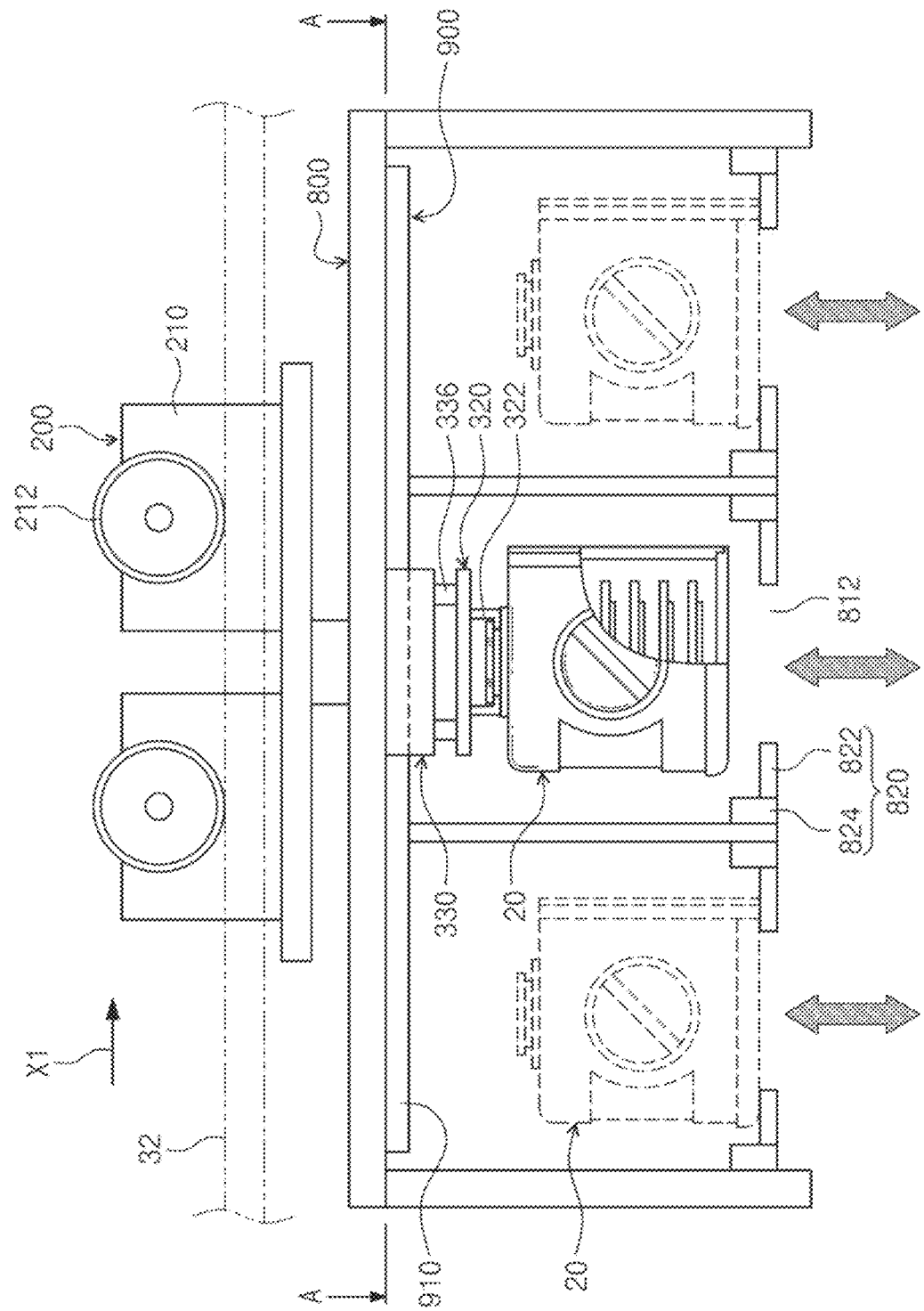
FIGS. 3 and 4 are diagrams illustrating the article transferring apparatus.
Figure 4:
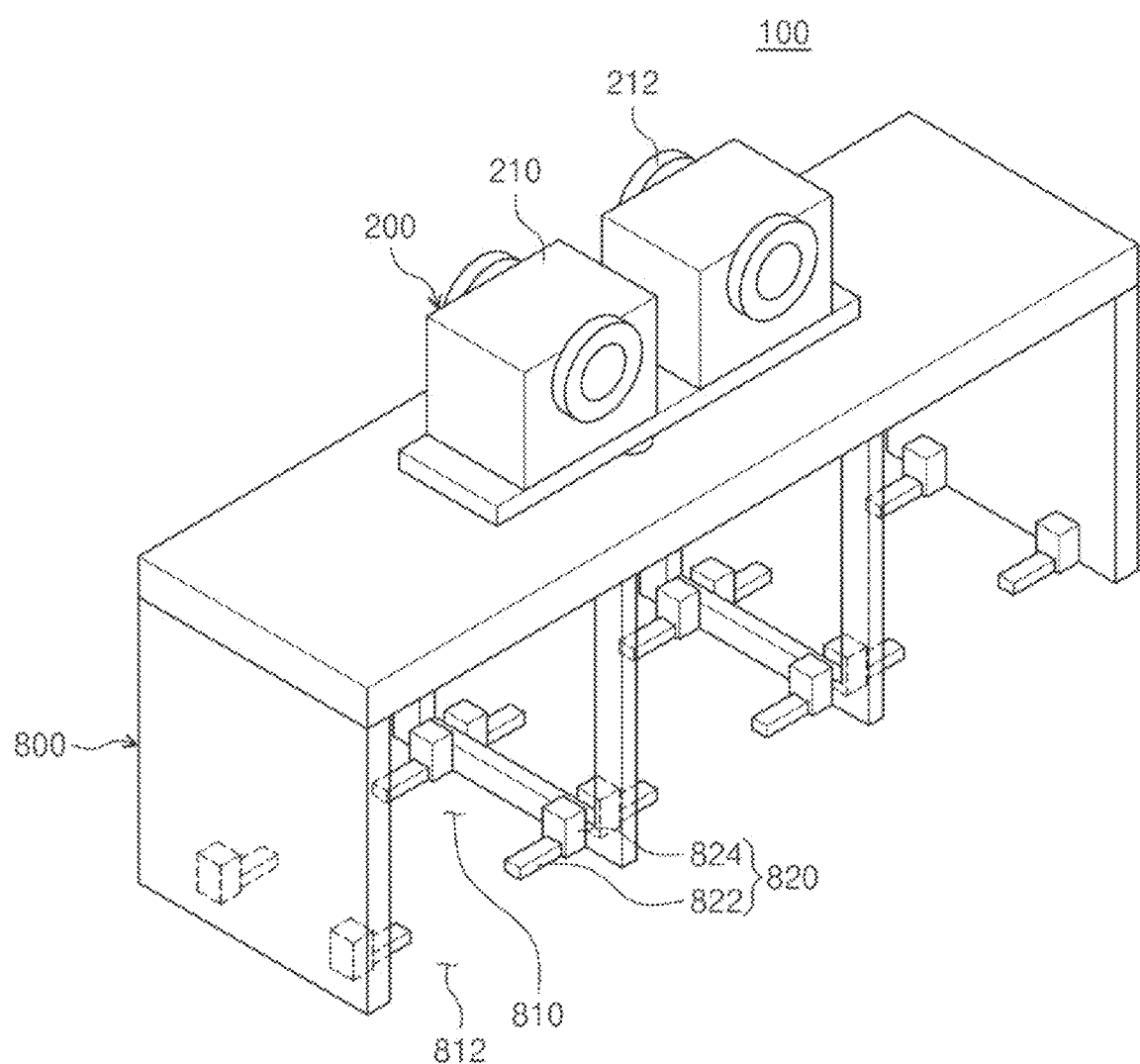
Figure 5:
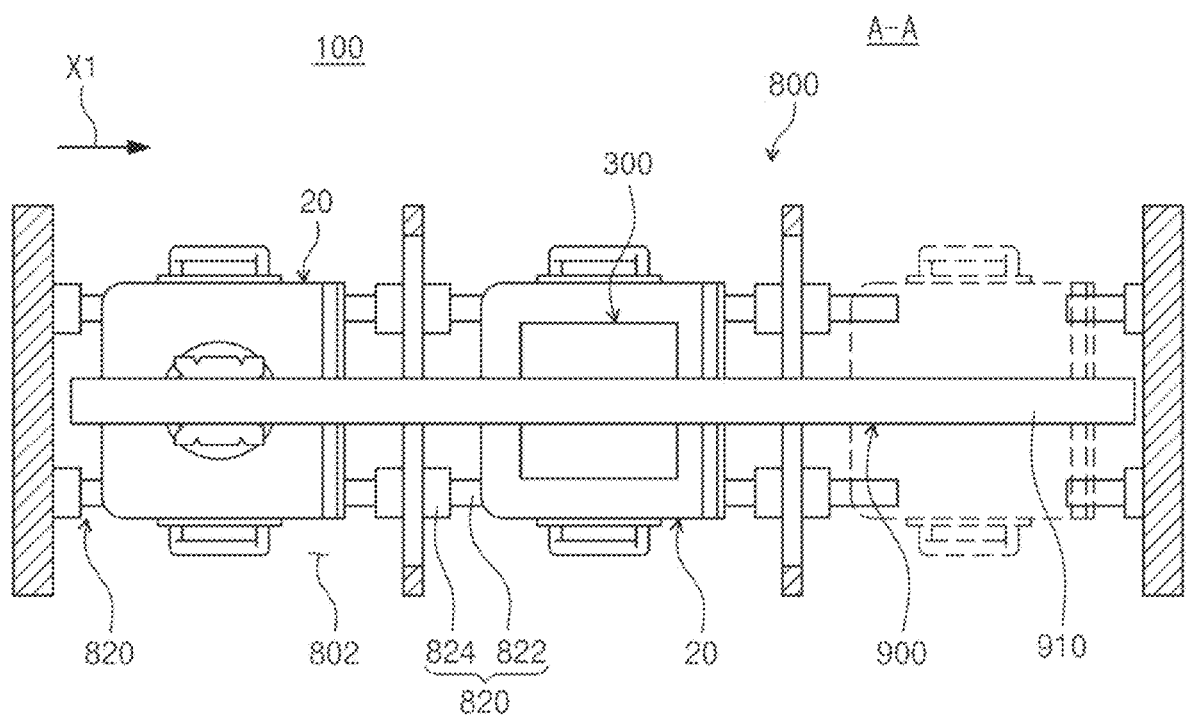
FIG. 5 is a planar cross-sectional view taken along line A-A illustrated in in FIG. 3.

FIGS. 3 to 5 are diagrams for describing the article transferring apparatus.

Figure 8:
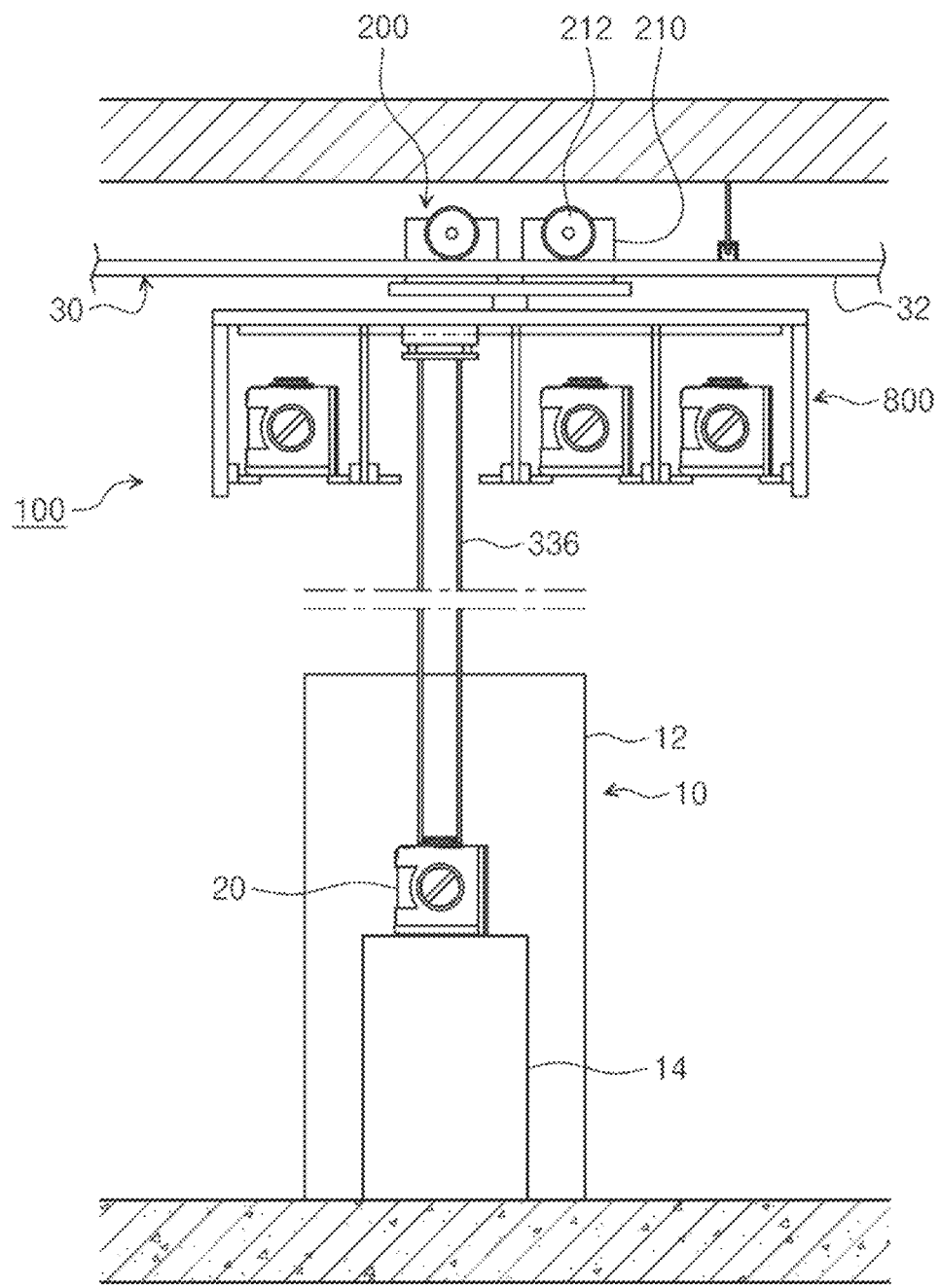
FIG. 8 is a diagram illustrating a modified example of the article transferring apparatus.

As illustrated in in FIGS. 3 to 5, the article transferring apparatus 100 transfers three transferring target articles 20 (hereinafter referred to as substrate accommodating containers). In the present exemplary embodiment, the article transferring apparatus is illustrated in as being able to transfer three transferring target articles in the state where the transferring target articles are loaded, but is not limited thereto, and is capable of simultaneously transferring four or more transferring target articles as illustrated in in FIG. 8.

In the present exemplary embodiment, the article transferring apparatus 100 may be a transferring vehicle including a vehicle 200, a vehicle main body 800, and a hoist module 300.

The vehicle 200 is a traveling module that travels along the travel rail 32 provided along the ceiling of a semiconductor manufacturing line by a separate driving unit. The vehicle 200 may include a body 210 having driving wheels 212 on both sides. Although not illustrated in, an actuator (for example, a driving motor) for rotating the driving wheel 212 may be provided inside the body 210. The body 210 travels along the travel rail 32. Specifically, the body 210 may travel while the travel wheels 212 rotate in a state of being in contact with the travel rail 32. Meanwhile, although not illustrated in, a steering wheel may be provided on the upper surface of the body 210. The steering wheel is provided to be movable along a horizontal direction perpendicular to the traveling direction of the body 210. For example, the steering wheel may move in the left and right directions of the body 210. The steering wheel may selectively contact a straight steering rail (not illustrated in) for guiding straight traveling and a branch steering rail (not illustrated in) for guiding branch traveling.

The vehicle main body 800 is connected to the vehicle 200 below the travel rail 32. The upper side of the vehicle main body 800 may be connected to the lower side of the vehicle 200 by at least one connection part. The vehicle main body 800 provides an interior space 802 having loading parts 810 in which the substrate accommodating containers 20 may be loaded. The vehicle main body 800 may be formed to have a structure in which both sides and a lower side are open so that the substrate accommodating container 20 may move in left and right directions and in a downward direction in the inner space 802. Here, both sides may be perpendicular to the traveling direction of the article transferring apparatus 100.

A horizontal moving member 900 is installed in the vehicle body main 800. The horizontal moving member 900 moves the hoist module 300 in a horizontal direction. The hoist module 300 may be moved to any one of the loading parts 810 of the vehicle main body 800 by the horizontal moving member 900.

The loading parts 810 may be arranged in a line in a direction parallel to a traveling direction X1 of the vehicle 200. That is, the substrate accommodating containers 20 may be loaded in a row on the loading parts 810 of the vehicle main body 800. The horizontal moving member 900 may include a first horizontal rail part 910 installed in a straight line in the vehicle body 800 along the traveling direction to correspond to the arrangement of the loading parts 810.

Each of the loading parts may store one substrate accommodating container. A bottom surface of the loading part has an open shape, and the substrate accommodating container gripped by the hoist module may be loaded and unloaded through the open bottom surface of the loading part.

Figure 6:
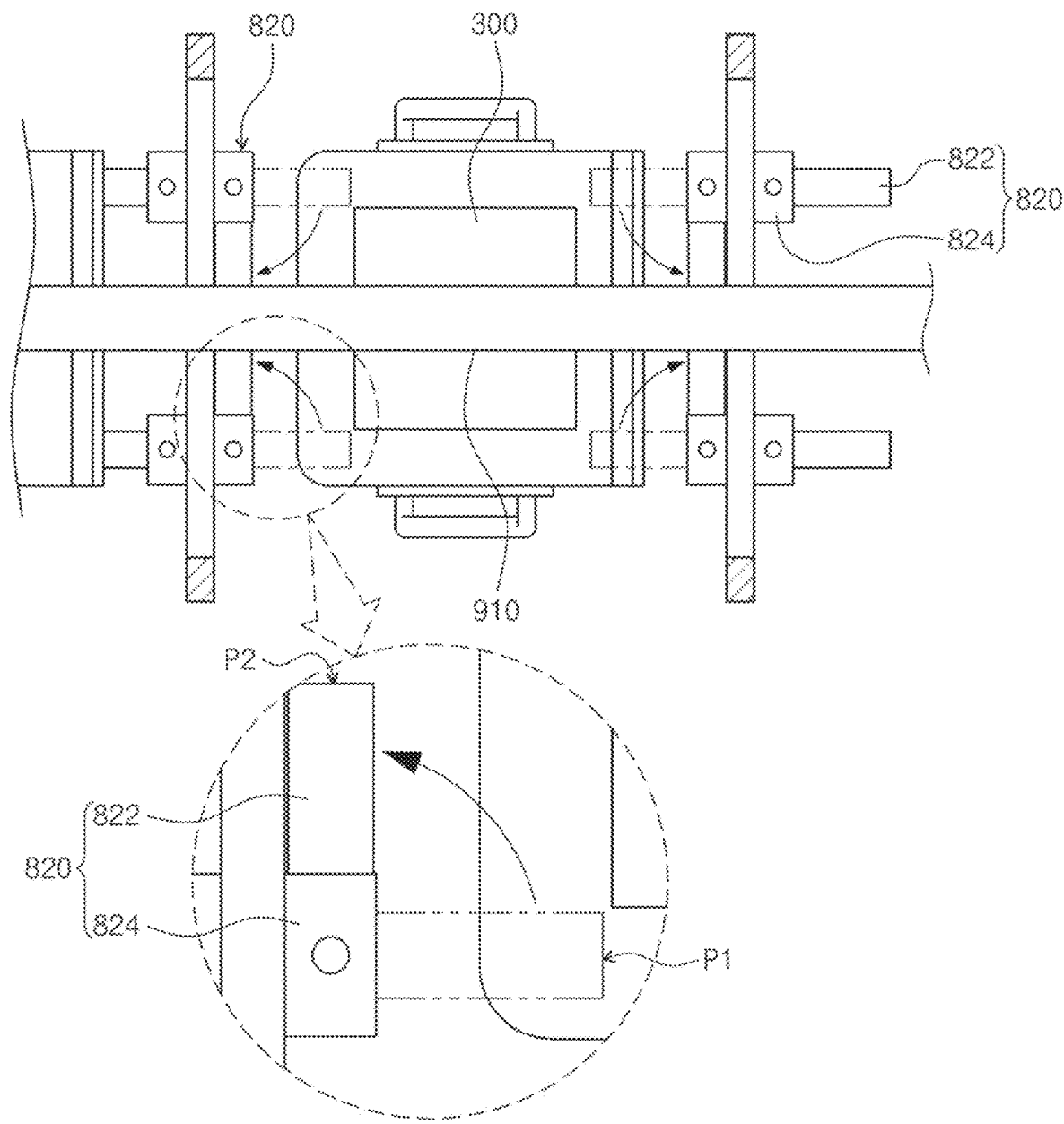
FIG. 6 is a diagram illustrating a fixing member.
Figure 7A:
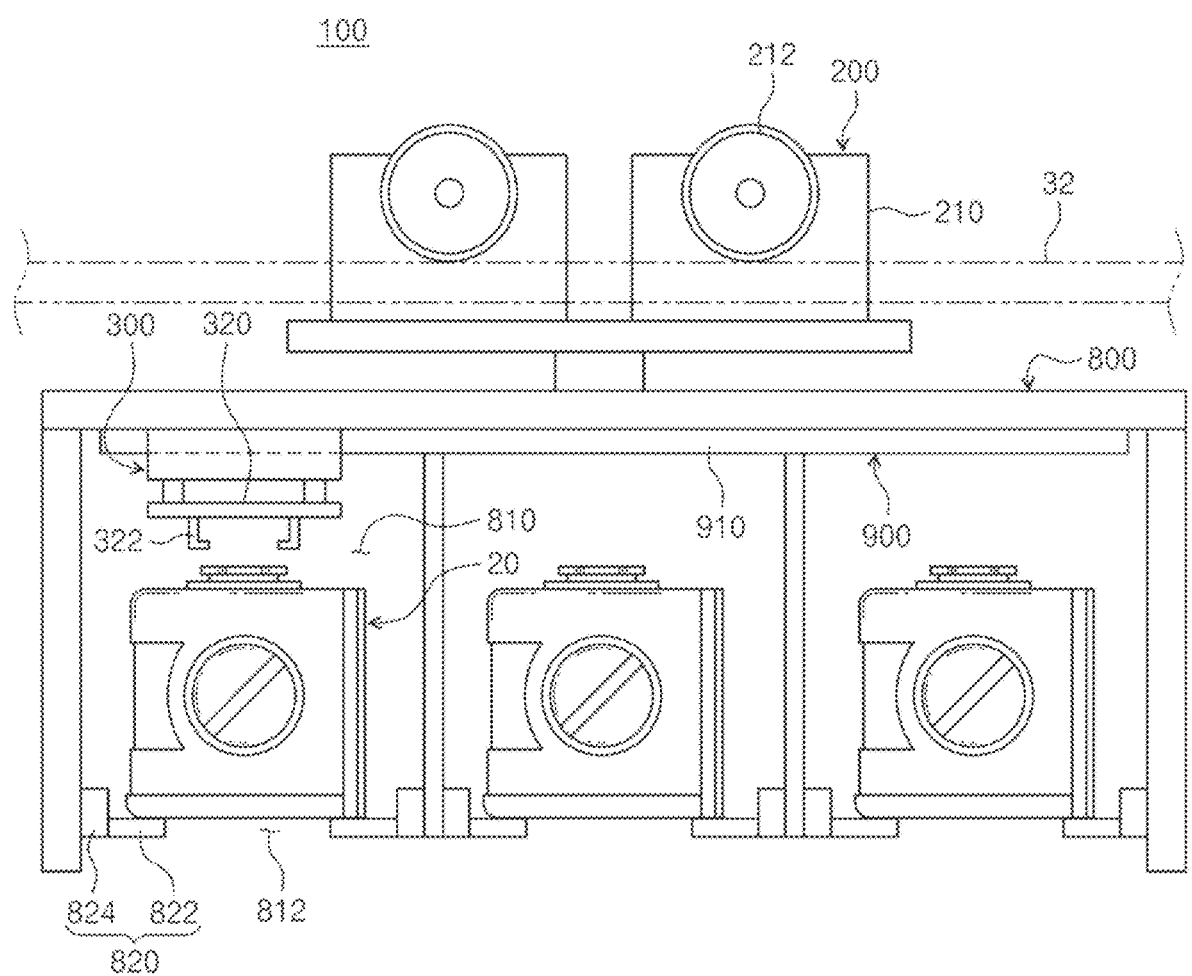
FIGS. 7A to 7D are diagrams illustrating an operation for putting down a substrate accommodating container loaded in a loading part to a mounting place step by step.
Figure 7B:
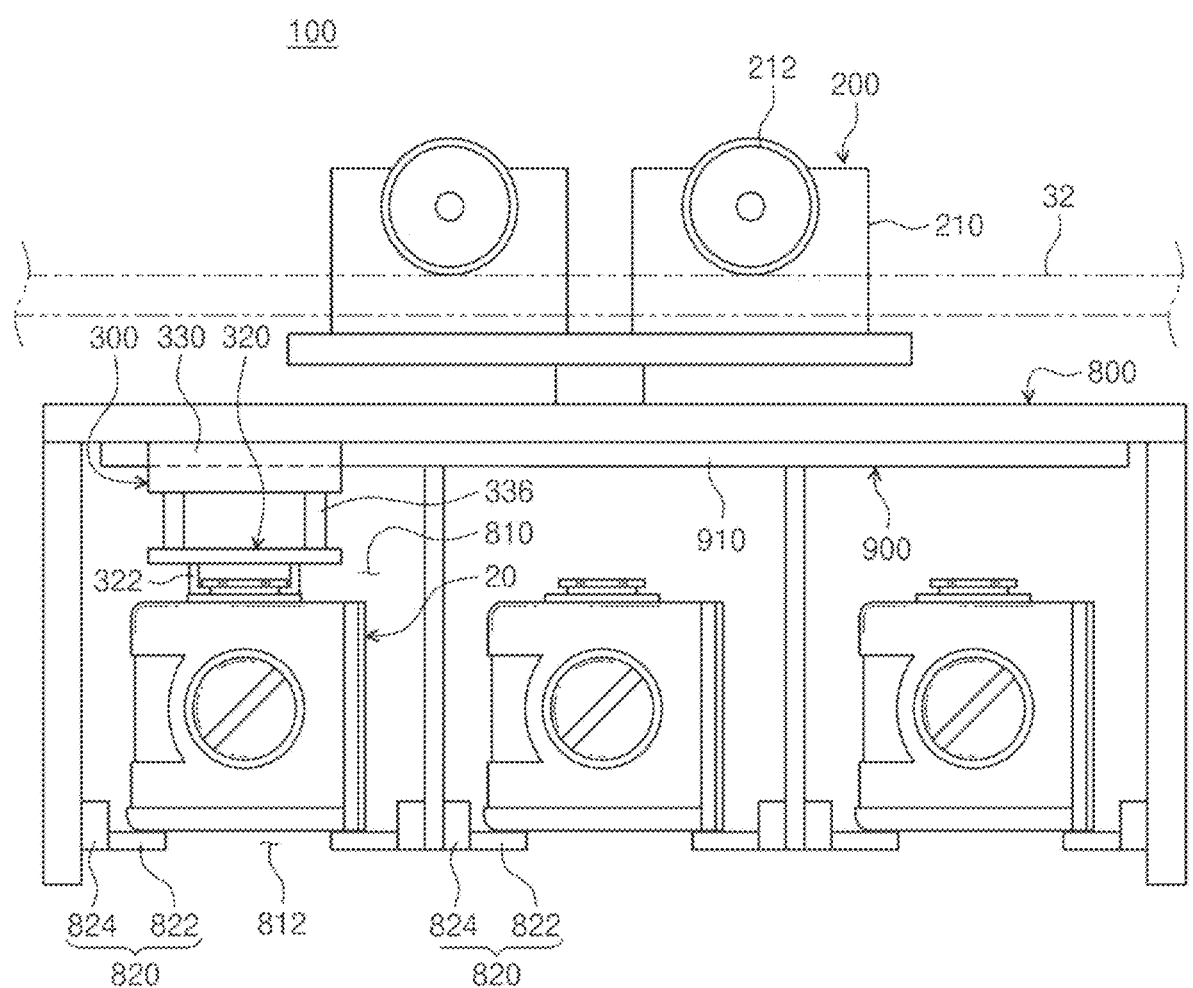
Figure 7C:
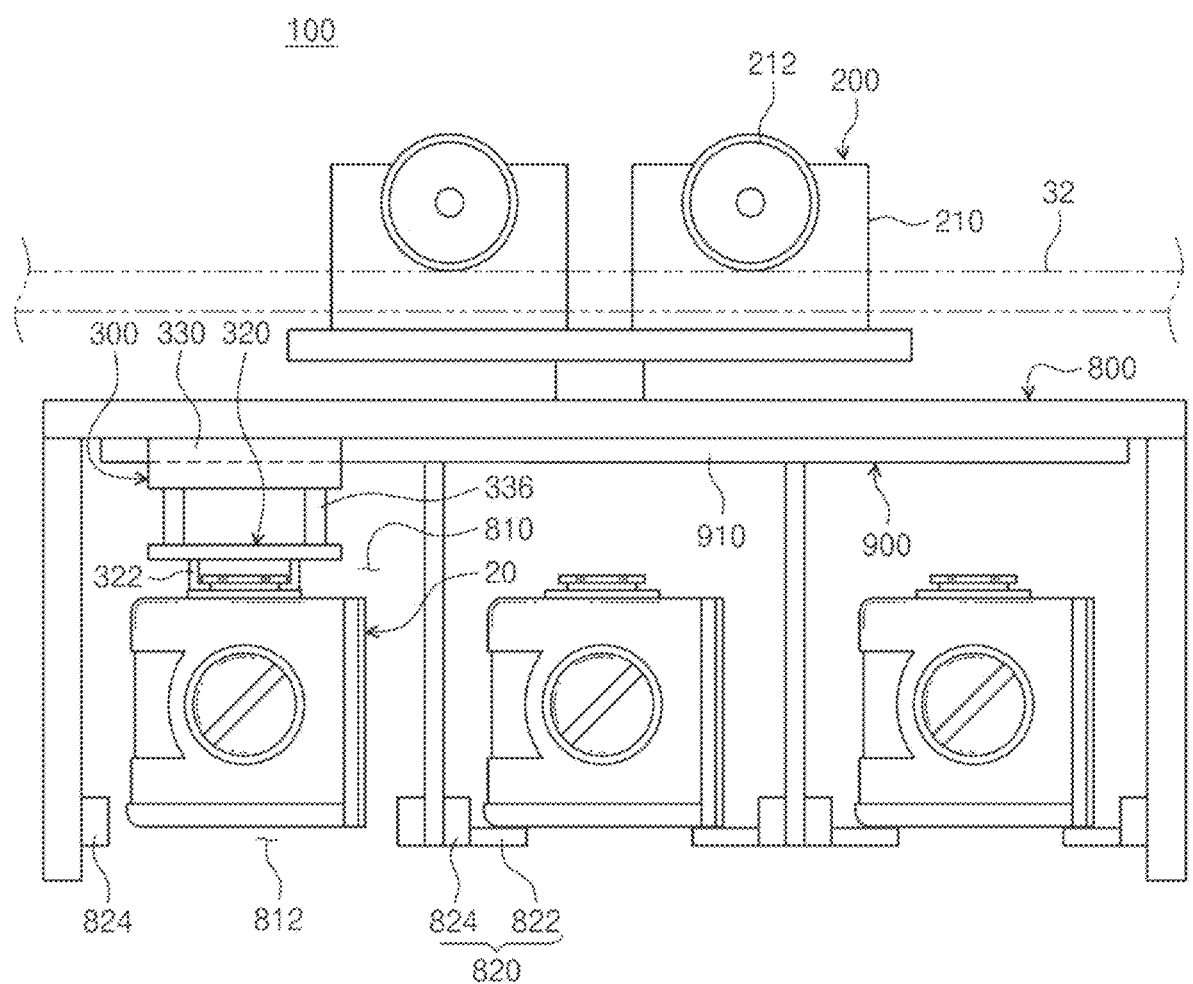
Figure 7D:
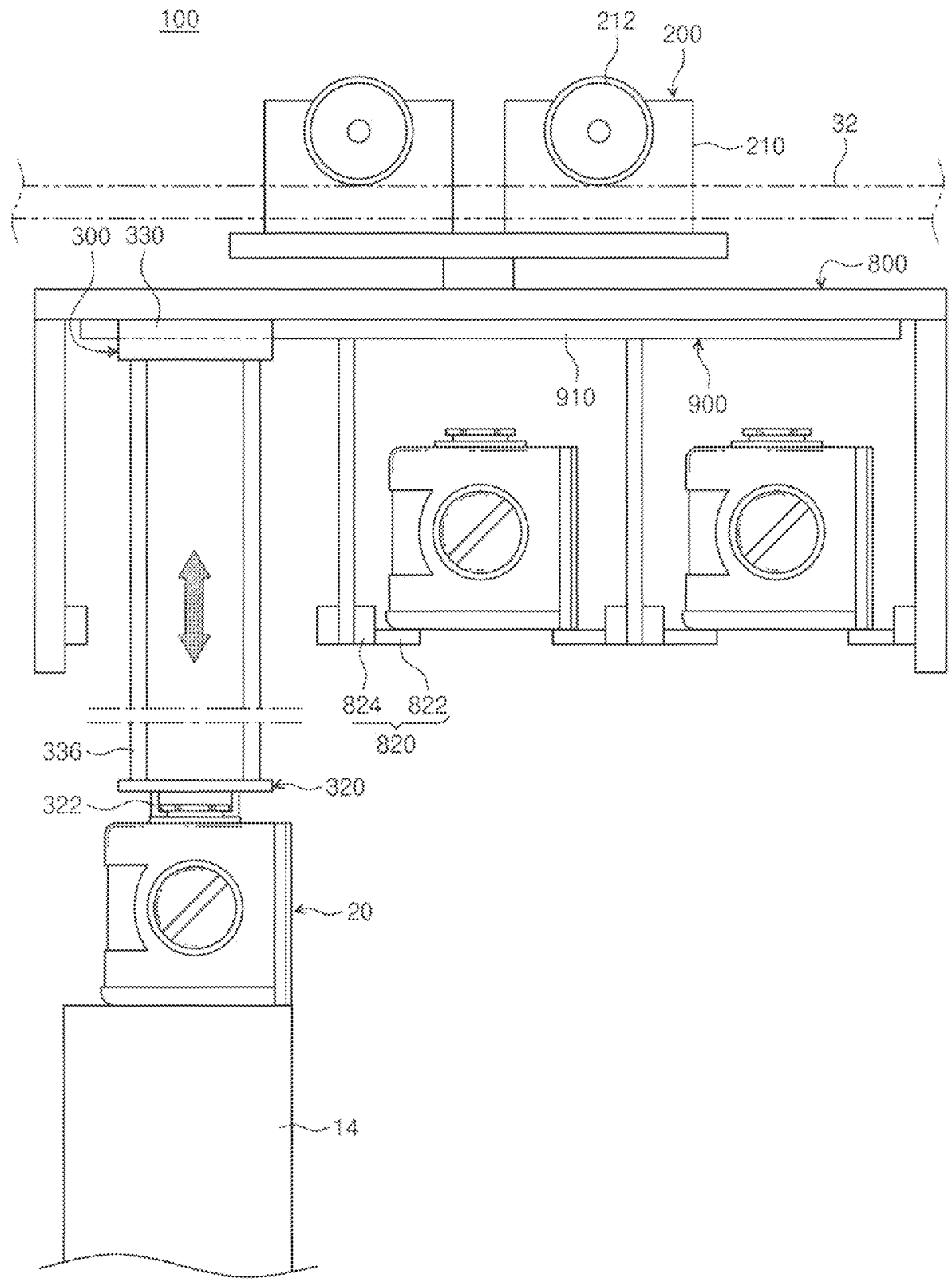

FIG. 6 is a diagram for describing an article fixing part. Referring to FIGS. 3 to 6, the vehicle main body 800 may include an article fixing part 820. The article fixing part 820 fixes the substrate accommodating container 20 loaded on the loading part 810. The substrate accommodating container 20 may be fixed by a plurality of article fixing parts 820. In the present exemplary embodiment, the vehicle main body 800 to which four article fixing parts 820 are applied is illustrated in, but the present invention is not limited thereto.

Each article fixing part 820 may include a fixing member 822 and an actuating member 824. The fixing member 822 fixes the substrate accommodating container 20 so as not to be separated from the loading part 810. The fixing member 822 may be provided to fix the bottom surface of the substrate accommodating container 20. Although not illustrated in, the fixing member 822 may further include a clamping means for fixing the side surface of the substrate accommodating container 20.

The fixing member 822 may be moved to a fixing position P1 and a releasing position P2 by the actuating member 824. The fixing member 822 may reciprocate between the fixing position P1 and the releasing position P2 while turning by the actuating member 824.

As illustrated in in FIG. 6, the fixing position P1 is a position at which the substrate accommodating container 20 located in the loading part 810 may be fixed. The releasing position P2 may be a position that does not interfere with the substrate accommodating container 20 when the substrate accommodating container 20 moves in and out through the open bottom surface 812 of the loading part 810.

For example, when the hoist module 300 desires to transfer the substrate accommodating container 20 from the mounting place to the loading part 810 or transfers the substrate accommodating container 20 from the loading part 810 to the mounting place, the substrate accommodating container 20 is transferred through the open bottom surface 812 of the loading part 810. At this time, the fixing member 822 stands by at the releasing position P2.

The hoist module 300 is provided on the vehicle main body 800. The hoist module 300 may load and unload substrate accommodating containers between the mounting place and the loading part. For example, the hoist module 300 may include a gripper unit 320 for picking up the substrate accommodating container 20 and a lifting unit 330 for lifting the gripper unit 320.

The gripper unit 320 grips or ungrips the substrate accommodating container 20. The gripper unit 320 may be connected to the lifting unit 330 through a plurality of lifting belts 336 and may include grippers 322 for gripping the substrate accommodating container 20. In addition, a flange configured to be gripped by the grippers 322 may be provided on an upper portion of the substrate accommodating container 20.

The gripper unit 320 may include a gripper driver (not illustrated in) for driving the grippers 322. For example, the gripper driver may operate the grippers 322 using a cam plate and a cam follower, and may also include a motor, a ball screw, and the like to move the cam plate. However, since the configuration of the gripper unit 320 itself may be changed in various ways, the scope of the present invention will not be limited thereby. The gripper unit 320 may be moved vertically by the lifting unit 330.

The lifting unit 330 moves the gripper unit 320 in the vertical direction. The lifting unit 330 may include a driver and the lifting belt 336. The lifting belt of the lifting unit 330 may be connected to the gripper unit 320. The lifting belt 336 may move the gripper unit 320 in the vertical direction by driving force generated by the driver. For example, the driver may generate driving force to wind or unwind the lifting belt 336 to move the gripper unit 320 in the vertical direction. However, the present invention is not limited thereto, and the lifting unit may be modified with various known devices capable of lifting and lowering the gripper unit 320.

FIGS. 7A to 7D are diagrams illustrating an operation for putting down the substrate accommodating container loaded in the loading part to the mounting place step by step.

The article transferring apparatus 100 is moved so that the substrate accommodating container 20 that is the transferring target is located on the upper portion corresponding to the mounting place 14 of the processing device.

Referring to FIGS. 7A to 7D, the hoist module 300 is moved to the top of the loading part 810 located on the left side of the vehicle main body 800 by the horizontal moving member 900. The grippers 322 of the gripper unit 320 are moved to grip the substrate accommodating container 20. When the grippers 322 grip the substrate accommodating container 20, the fixing member 822 is moved from the fixing position P1 to the releasing position P2 while turning by the actuating member 824 (see FIG. 6). The gripper unit 320 is lowered by the lifting unit 330, and the substrate accommodating container 20 gripped by the gripper unit 320 is moved through the open bottom surface of the loading part 810 and mounted on the mounting place of the processing device.

As described above, the article transferring apparatus of the present invention is capable of increasing transferring efficiency and preventing abnormal situations, such as a bottleneck phenomenon, in advance by transferring the substrate accommodating containers having the same destination or direction in a loaded state.

Figure 9:
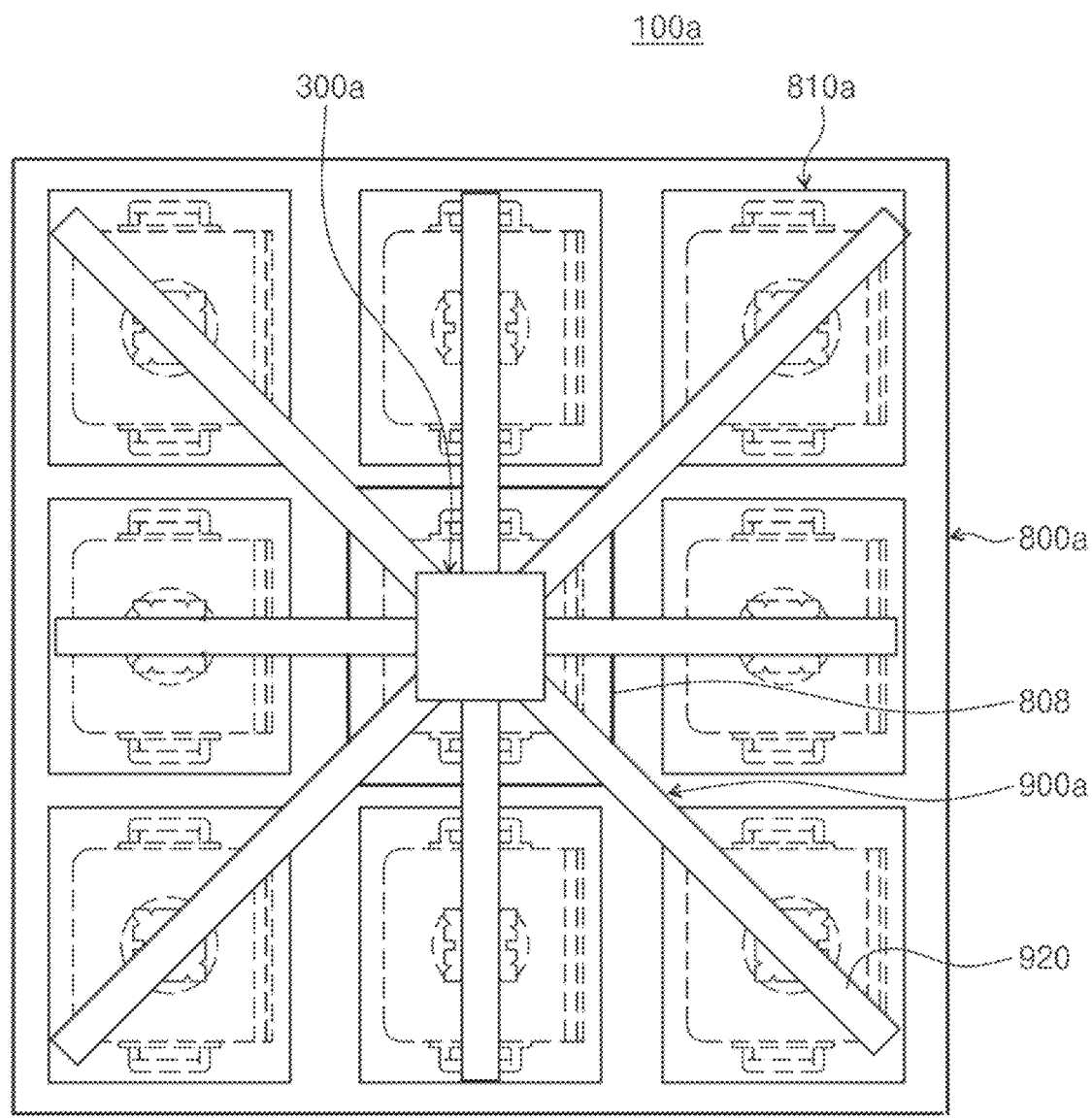
FIG. 9 is a layout view of a loading part of a vehicle main body illustrating another example of a loading part in the article transferring apparatus.

FIG. 9 is a layout view of a loading part of a vehicle main body illustrating another example of a loading part in the article transferring apparatus.

Referring to FIG. 9, a vehicle main body 800a of an article transferring apparatus 100a has an article entrance 808 at the center of the floor through which a substrate accommodating container may enter and exit. In addition, the loading parts 810a are disposed in all directions around the article entrance 808. A hoist module 300a may be moved in the horizontal direction so that a gripper unit 320 (not illustrated in in FIG. 9, but see FIG. 3) grips the substrate accommodating container 20 loaded on each of loading parts 810a at the top of the article entrance 808 of the vehicle main body 800a. For example, the horizontal moving member 900a may include horizontal rail parts 920 provided to move the hoist module 300 in all directions from the center of the vehicle main body 800a.

The article transferring apparatus 100a having the above-described configuration may load the substrate accommodating container 20 in the selected loading part 810a by brining, by the hoist module, the substrate accommodating container 20 loaded on the loading part 810a and carries the substrate accommodating container 20 out through the article entrance 808 or gripping, by the hoist module 300, the substrate accommodating container 20 in the mounting place and carrying the substrate accommodating container 20 in through the article entrance 808.

The foregoing exemplary embodiments are presented for helping the understanding of the present invention, and do not limit the scope of the present invention, and it should be understood that various modified exemplary embodiments from the foregoing exemplary embodiments are also included in the scope of the present invention. The technical protection scope of the present invention should be determined by the technical spirit of the claims, and it should be understood that the technical protection scope of the present invention is not limited to the literal description of the claims itself, but is substantially equivalent to the technical value.

What is claimed is:

1. An article transferring apparatus, comprising:
    a vehicle configured to travel along a travel rail installed on a ceiling;
    a vehicle main body connected to a lower side of the vehicle, the vehicle main body defining a plurality of loading spaces, in which a plurality of articles are to be loaded, respectively, the vehicle main body including a horizontal moving member; and
    a hoist module including a grip unit, the grip unit configured to grip and load and unload articles to/from the loading spaces,
    wherein the horizontal moving member is configured to move the hoist module within the vehicle main body to cause the hoist module to be positioned above a select one of the articles loaded in the loading spaces.

2. The article transferring apparatus of claim 1, further comprising:
    the horizontal moving member installed in the vehicle main body and configured to move the hoist module in a horizontal direction so that the grip unit moves to any one of the loading spaces.

3. The article transferring apparatus of claim 2, wherein in the vehicle main body, the loading spaces are provided in parallel with a traveling direction of the vehicle so that articles are loaded in a row along the traveling direction of the vehicle, and
    the horizontal moving member includes a horizontal rail part installed in the vehicle main body in a straight line along the traveling direction.

4. The article transferring apparatus of claim 2, wherein the vehicle main body includes an article entrance through which articles enter and exit in a center of a floor, and the loading spaces are disposed in all directions around the article entrance.

5. The article transferring apparatus of claim 4, wherein the horizontal moving member includes horizontal rail parts configured to allow the hoist module to move in all directions from the center of the vehicle main body.

6. The article transferring apparatus of claim 2, wherein the hoist module further includes a lifting unit configured to lift the grip unit.

7. The article transferring apparatus of claim 2, wherein the vehicle main body further includes an article fixing part configured to fix an article located in the loading spaces.

8. The article transferring apparatus of claim 7, wherein the article fixing part includes:
    a fixing member configured to fix the article so that the article is not separated from the loading spaces; and
    an actuating member configured to move the fixing member between a fixing position where the fixing member fixes the article and a releasing position so that the article loaded in the loading spaces is lifted by the hoist module.

9. The article transferring apparatus of claim 8, wherein the fixing member is configured to reciprocate between the fixing position and the releasing position while turning by the actuating member.

10. An article transferring apparatus, comprising:
    a travel rail along a ceiling of a manufacturing line in which processing devices are continuously disposed; and
    a transferring unit configured to travel on the travel rail and send and receive an article to and from a mounting place of the processing devices,
    wherein the transferring unit includes
        a vehicle configured to travel along the travel rail on the ceiling,
        a vehicle main body connected to a lower side of the vehicle, the vehicle main body defining a plurality of loading spaces, in which a plurality of articles are to be loaded, respectively, the vehicle main body including loading parts configured to load a corresponding one of the articles thereon,
        a hoist module installed in the vehicle main body and configured to exchange the article with the mounting place and each of the loading parts, and
        a horizontal moving member configured to horizontally move the hoist module in the vehicle main body so that the hoist module is located on any one of the loading parts,
    wherein the horizontal moving member is configured to move the hoist module within the vehicle main body to cause the hoist module to be positioned above a select one of the articles loaded in the loading spaces.

11. The article transferring apparatus of claim 10, wherein the hoist module includes:
    a grip unit configured to grip the article; and
    a lifting unit configured to move up and down the grip unit.

12. The article transferring apparatus of claim 10, wherein the loading parts are configured so that articles are loaded in a line along a traveling direction of the vehicle, and
    the horizontal moving member includes a horizontal rail part installed in a straight line in the vehicle main body along the traveling direction.

13. The article transferring apparatus of claim 10, wherein the vehicle main body includes an article entrance through which articles enter and exit in a center of a floor, and the loading parts are disposed in all directions around the article entrance.

14. The article transferring apparatus of claim 13, wherein the horizontal moving member includes horizontal rail parts configured to allow the hoist module to move in all directions from the center of the vehicle main body.

15. The article transferring apparatus of claim 10, wherein the loading parts include an article fixing part that is configured to fix the article.

16. The article transferring apparatus of claim 15, wherein the article fixing part includes:
a fixing member configured to fix the article so that the article is not separated from the loading spaces; and
an actuating member configured to move the fixing member to a fixing position for fixing the article and a releasing position where the hoist module transfers the article from the mounting place to the loading parts or transfers the article from the loading parts to the mounting place.

17. The article transferring apparatus of claim 16, wherein the fixing member is configured to reciprocate between the fixing position and the releasing position while turning by the actuating member.

18. An article transferring apparatus, comprising:
a travel rail along a ceiling of a manufacturing line in which processing devices are continuously disposed; and
a transferring unit configured to travel on the travel rail and send and receive an article to and from a mounting place of the processing device,
wherein the transferring unit includes
a vehicle configured to travel along the travel rail on the ceiling,
a vehicle main body connected to a lower side of the vehicle, the vehicle main body defining a plurality of loading spaces, in which a plurality of articles are to be loaded, respectively, the vehicle main body including loading parts configured to load a corresponding one of the articles thereon,
a hoist module installed in the vehicle main body and configured to exchange the article with the mounting place and each of the loading parts; and
a horizontal moving member configured to horizontally move the hoist module in the vehicle main body so that the hoist module is located on any one of the loading parts, and
the loading parts have a straight arrangement in which articles are loaded in a line along a traveling direction of the vehicle or a rhombic arrangement in which articles are loaded in all directions around a central opening through which articles enter and exist,
wherein the horizontal moving member is configured to move the hoist module within the vehicle main body to cause the hoist module to be positioned above a select one of the articles loaded in the loading spaces.

19. The article transferring apparatus of claim 18, wherein the loading parts include an article fixing part configured to fix the article.

20. The article transferring apparatus of claim 18, wherein the hoist module includes
a grip unit configured to grip and load/unload one article selected from among the articles loaded in the loading parts, and
a lifting unit configured to move up and down the grip unit, and
the vehicle main body further includes an article fixing part, the article fixing part including,
a fixing member configured to fix the article so that the article is not separated from the loading spaces, and
an actuating member configured to move the fixing member to a fixing position for fixing an article and a releasing position where the hoist module transfers the article from the mounting place to the loading parts or transfers the article from the loading parts to the mounting place.

* * * * *